Sept. 8, 1964 G. WERTWIJN 3,148,284

SEMI-CONDUCTOR APPARATUS WITH FIELD-BIASING MEANS

Filed Jan. 30, 1959

INVENTOR
George Wertwijn

BY Francis W. Crotty

ATTORNEY

United States Patent Office 3,148,284

Patented Sept. 8, 1964

3,148,284

SEMI-CONDUCTOR APPARATUS WITH FIELD-BIASING MEANS

George Wertwijn, Park Ridge, Ill., assignor to Zenith Radio Corporation, a corporation of Delaware Filed Jan. 30, 1959, Ser. No. 790,261

8 Claims. (Cl. 307—88.5)

This invention relates in general to semi-conductor devices and, more specifically, to semi-conductor devices having improved rectification efficiency and high-frequency response.

It is well understood that rectification may be achieved by applying an alternating-current potential across the junction formed by two contiguous zones of opposed conductivity in a semi-conductor device. In general, the half cycles of one polarity of the applied potential serve as a forward bias and support current flow through the device while half cycles of the opposite polarity constitute a reverse bias in the presence of which the device does not conduct. Since conduction occurs only during half cycles of one polarity, half-wave rectification is accomplished.

The mechanism of current flow, of course, involves the interchange or injection of carriers across the junction but the difficulty of removing carriers from the vicinity of the junction as the applied potential changes polarity from that serving as a forward bias supporting conduction to that constituting a reverse bias leads to both inefficiency and poor high-frequency response in prior-art devices. At the instant the applied potential crosses its zero or A.-C. axis, there are migratory carriers on both sides of the junction. If the carriers return to the zone from whence they came, and there is a tendency for this to occur during back-bias intervals, reverse-current flows and the rectification efficiency decreases. Both conditions are decidedly undesirable. Additionally, movement of the carriers through the semi-conductor is by diffusion which is attended by loss due to recombination and to the limitations of the fixed rate of travel of the minority carriers. This further impairs efficiency and contributes to poor high-frequency response.

In one prior structure designed to improve the properties of the rectifier, a direct-current bias potential is applied to one conductivity zone of the semi-conductor in a direction which is generally parallel to the junction and transverse to the direction of current flow during rectification. This bias establishes an electric field in the vicinity of the junction so directed as to sweep out minority carriers at the time the alternating potential crosses its A.-C. axis going from a condition of forward bias to one of backward bias across the junction. This impedes the return of such carriers across the junction and tends to improve efficiency but at the cost of heat losses resulting from the bias current. Moreover, this approach is distinctly limited in application and fails to provide effective improvement in the device.

Another structure heretofore proposed features the use of a third conductivity zone arranged to form a second junction in the device. This junction is space opposed relative to the rectifying junction and is back-biased by means of a direct-current potential source. The second junction may be considered as a second path for attracting and absorbing some of the minority carriers as the A.-C. potential swings the rectifying junction from a condition of conduction to one of non-conduction. Like the last-mentioned structure, this approach is limited in effectiveness; the carriers in the immediate neighborhood of the rectifying junction are still able to recross the junction and reduce efficiency.

An important object of this invention, therefore, is to provide a semi-conductor device which overcomes the afore-mentioned limitations of prior structures.

Another object of this invention is to provide a semi-conductor device with improved rectification efficiency.

A further object of this invention is to provide a semi-conductor device characterized by improved operation at high frequencies.

A semi-conductor apparatus embodying the invention comprises a semi-conductor body having a first conductivity zone of one type and having a pair of conductivity zones of a second type separated from one another and disposed adjacent the first zone to constitute therewith a pair of junctions. There are the usual electrodes in ohmic contact with each of the zones and a bias source, connected to the electrodes, develops a potential gradient in the first zone which establishes a depletion field encompassing a particular one of the junctions and which tends to also establish a difference of potential across that one junction. Additionally, there are means connected to that one junction for establishing in the apparatus a signal-translating load circuit in which the static direct current is substantially zero.

The features of the present invention which are believed to be novel are set forth with particularity in the appended claims. The organization and manner of operation of the invention, together with further objects and advantages thereof, may best be understood by reference to the following description taken in connection with the accompanying drawing, in the several figures of which like reference numerals identify like elements, and in which:

Figure 1:
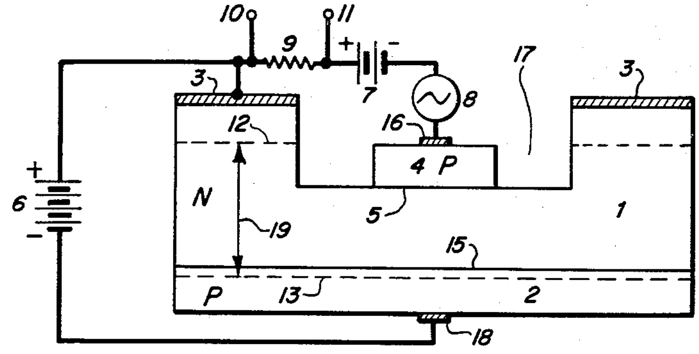
FIGURE 1 is a schematic drawing of one embodiment of this invention.

Referring now more particularly to FIGURE 1, the semi-conductor device there shown includes a semi-conductor body having a first conductivity zone or base 1 composed of germanium or silicon of N- or P-type conductivity material. For purposes of illustration, base zone 1 is assumed to be N-type germanium. While the semi-conductor may be of any desired shape, it will be assumed to be circular or wafer shaped. One face of base zone 1 is provided with a well or recess 17 formed in any suitable manner such as etching. In addition to base zone 1, there are a pair of conductivity zones of a second type, separated from one another and disposed adjacent the first zone to constitute therewith a pair of junctions. More particularly, there is a zone 4 which is opposite in conductivity type material to zone 1 and is disposed in recess 17 thereof to form a first junction 5 with base zone 1. Zone 4 may be assumed to be P-type germanium. A third zone 2, having the same conductivity as zone 4, is disposed adjacent that face of zone 1 which is opposite to the recessed surface and forms a second junction 15.

There are the usual electrodes in ohmic contact with each of the several zones 1, 2 and 4. The base contact 3 is annular in shape, being a metallic deposit on the area of base zone 1 which surrounds its recessed portion 17. Electrodes 16 and 18 similarly are conductive deposits affixed to zones 4 and 2, respectively.

In accordance with this invention, a bias source is connected to certain of the electrodes in order to develop a potential gradient which establishes a depletion field in the base zone encompassing a portion of recess 17 and all of junction 5 disposed therein. Specifically, the bias is represented as a direct current source or battery 6 connected between base contact 3 and electrode 18. While this establishes the desired depletion field, as discussed in more detail hereinafter, it has a tendency to establish a difference of potential across junction 5. Therefore the structure is additionally provided with means connected to that junction for the purpose of establishing a signal path in the semi-conductor device in which the static direct current is substantially zero. In the embodiment under consideration, this path is established by a load resistor 9, a second direct current biasing source 7 and a signal source 8 connected in series between base contact 3 and electrode 16. Bias 7 is chosen to apply, by means of this circuit, a voltage to junction 5 of the appropriate polarity and magnitude to compensate the difference in potential which tends to be established across that junction due to the presence of first bias source 6 employed to develop the desired depletion field. This selection of source 7 in relation to the difference of potential otherwise imposed upon the junction results in a static direct current in the rectifying or signal path which is substantially zero. The signal to be rectified is represented by source 8.

In operation, signal source 8 applies an alternating potential across junction 5. On the positive half cycles of the signal, zone 4 is positive with respect to the portion of zone 1 immediately adjacent to junction 5 hence this junction is forwardly biased. Under these conditions, current carriers are injected across junction 5 and current flows in the signal-translating circuit including load resistor 9. Upon crossing the junction, the minority carriers come immediately under the influence of a depletion field 19 established by battery 6 and are swept towards junction 15. The effect of this field augments the normal diffusion of carriers and the rate of travel of the carriers across zone 1 is thereby increased, or to put it in another way, transit time is decreased wtih a resulting increase in high-frequency response.

At the instant the alternating signal changes the potential condition across junction 5 from a forward to a backward bias, there are minority carriers in zone 1 in transit toward junction 15. These carriers remain under the influence of the depletion field and continue their travel towards the junction. This decreases the tendency toward reverse current flow as the signal undergoes its negative half cycle excursion and hence the efficiency of rectification is greatly improved.

Since the depletion field is established with substantially no attendant current flow and since battery 7 causes the signal path to experience no static direct current, the losses suffered in prior-art devices as described above are eliminated. Moreover, the device of FIGURE 1 has greater application than the prior-art arrangements because the limitation upon the strength of the depletion field is dependent upon the breakdown characteristics of the backwardly biased junction hence a much higher volt per centimeter field strength can be maintained within the device. Additionally, the device embodying the invention is characterized by the fact that the field effect is parallel to the direction of current flow rather than transverse thereto as in prior devices. The effect of this is to more completely sweep the minority carriers from the vicinity of the rectifying junction. As a result of the rectification of the signal voltage in the signal-translating circuit current flows during the positive half cycles of the signal and a usable output is taken between terminals 10, 11.

Figure 2:
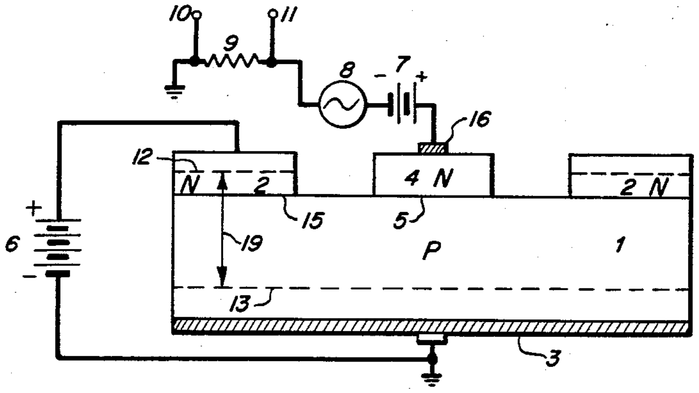
FIGURE 2 is a schematic drawing of another embodiment of this invention.

Referring now to the embodiment of FIGURE 2 conductivity zones 2 and 4 are located on the same face of zone 1 and, in this case, zone 1 has been selected as P-type germanium whereas zones 2, 4 have been chosen as N-type germanium, it being understood that opposite conductivity types may be used with equal success. Zone 2 is ring shaped and is concentric to but spaced from zone 4. Bias source 6 develops a potential gradient in zone 1 across junction 15, giving rise to the desired depletion field within the region 19 delineated between dashed lines 12 and 13 encompassing junction 5. The signal-translating circuit is connected across junction 5 and the operation of this structure in accomplishing rectification is similar to that of FIGURE 1. It will be understood that bias source 6 may be connected between ohmic contact 3 and zone 4 to establish the depletion zone but in such case the signal-translating path is to be connected to ring zone 2.

With the selected types of conductivity zones in this embodiment, current flows in the signal-translating circuit on negative half cycles of the signal voltage and a usable output is taken between terminals 10, 11 as in FIGURE 1.

Figure 3:
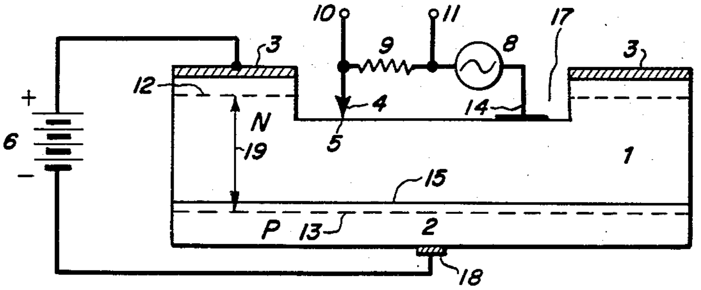
FIGURE 3 is a schematic drawing of a third embodiment of this invention.

In the embodiment of FIGURE 3, zones 1 and 2 are essentially the same as in the structure of FIGURE 1 but the third conductivity zone of P-type conductivity material is here afforded by means of a point contact 4 which engages zone 1 within its recessed portion 17 to constitute therewith a rectifying junction 5. In addition to this contact, the semi-conductor device has a second contact 14 likewise positioned within recess 17 in ohmic contact with zone 1 and arranged with contact 4 to engage zone 1 at equi-potential points within the depletion field established in zone 1 by means of battery 6 as explained in conjunction with the arrangement of FIGURE 1. The load resistor 9 and signal source 8 are series connected between contacts 4 and 14 to complete the signal-translating path of the device. In this embodiment, there is no need for the compensating battery employed in the arrangements of FIGURES 1 and 2 because contacts 4 and 14 are at a common potential level.

Rectification is accomplished in this structure in essentially the same way as in the device of FIGURE 1, junction 5 being forwardly biased during positive half cycles of the applied alternating potential as required, to support conduction and being reversed biased in opposite half cycles. The depletion field resulting from battery 6 sweeps out minority carriers found in the vicinity of junction 5 as the applied signal crosses its A.-C. axis from a condition of conduction to one of non-conduction and this sweeping effect enhances the rectification efficiency and high-frequency response of the device.

Figure 4:
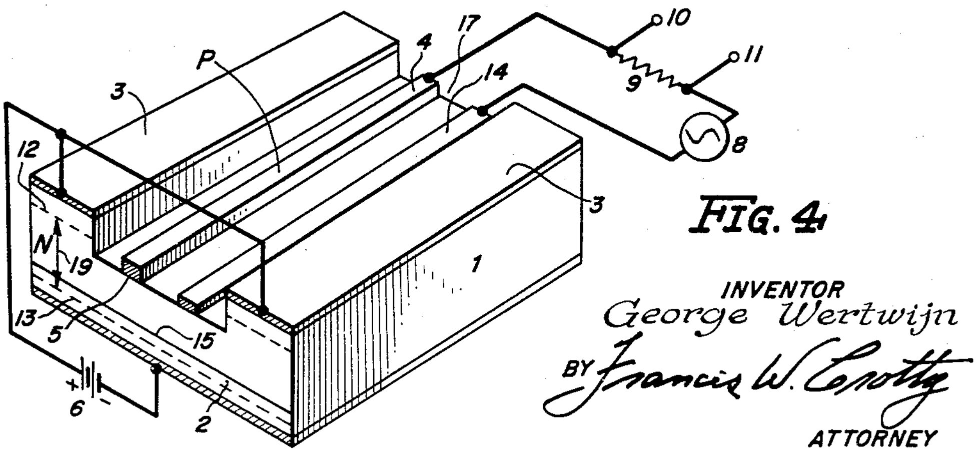
FIGURE 4 is a schematic drawing of still another embodiment of this invention.

The structure of FIGURE 3 features the location of contacts 4 and 14 within an annular recess 17 of zone 1 whereas in the modification of FIGURE 4, this recess is elongated. Elongated is here used in the sense that the width dimension of the recess is small relative to its length. For this construction a pair of elongated electrodes 4, 14 are disposed within the recessed portion of zone 1 at points of equi-potential within the depletion field. Electrode 4 is composed of a conductivity type material opposite that in zone 1 and forms junction 5 therewith and electrode 14 is in simple ohmic contact with zone 1. Electrode 3 comprises two ohmic contacts disposed on zone 1 adjacent opposed sides of the elongated recess. The device is otherwise the same in structure and operation as that of FIGURE 3.

While particular embodiments of the invention have been shown and described, it will be obvious to those skilled in the art that changes and modifications may be made without departing from the invention in its broader aspects, and, therefore, the aim in the appended claims is to cover all such changes and modifications as fall within the true spirit and scope of the invention.

I claim:

1. A semi-conductor apparatus comprising: a semi-conductor body having a first conductivity zone of one type and having a pair of conductivity zones of a second type separated from one another and disposed adjacent said first zone to constitute therewith a pair of junctions; electrodes in ohmic contact with each of said zones· means, including a bias source connected to said electrodes, for developing a potential gradient in said first zone which establishes a depletion field in said first zone encompassing a particular one of said junctions and which tends to establish a difference of potential across said one junction; and means connected to said one junction for establishing in said apparatus a signal-translating load circuit in which the static direct current is substantially zero.

2. A semi-conductor apparatus comprising: a semi-conductor body having a first conductivity zone of one type and having a pair of conductivity zones of a second type separated from one another and disposed adjacent said first zone to constitute therewith a pair of junctions; electrodes in ohmic contact with each of said zones; means, including a first bias source connected to said electrodes, for developing a potential gradient in said first zone which establishes a depletion field in said first zone encompassing a particular one of said junctions and which tends to establish a difference of potential across said one junction; and means, including a second bias source, connected to said one junction for establishing a signal-translating load circuit in said apparatus and for applying a voltage to said one junction to compensate said difference of potential so that the static direct current in said load circuit path is substantially zero.

3. A semi-conductor apparatus comprising: a semi-conductor body having a first conductivity zone of one type provided with a recess in one surface thereof and having a pair of conductivity zones of a second type one of which is disposed in said recess while the other is adjacent another surface of said first zone, said pair of zones forming junctions at their meeting surfaces with said first zone; electrodes in ohmic contact with each of said zones; means, including a bias source connected to said electrodes, for developing a potential gradient which establishes a depletion field in said first zone encompassing said recess and the one of said junctions formed therein and which tends to establish a difference of potential across said one junction; and means connected to said one junction for establishing in said apparatus a signal translating load circuit in which the static direct current is substantially zero.

4. A semi-conductor apparatus comprising: a semi-conductor body having a first conductivity zone of one type provided with a recess in one surface thereof and having a pair of conductivity zones of a second type one of which is disposed in said recess while the other is adjacent another surface of said first zone, said pair of zones forming junctions at their meeting surfaces with said first zone; electrodes in ohmic contact with each of said zones; means, including a bias source connected to said electrodes, for developing a potential gradient which establishes a depletion field in said first zone encompassing said recess and the one of said junctions formed therein and which tends to establish a difference of potential across said one junction; and means, including a second bias source, connected to said one junction for establishing a signal translating load circuit in said apparatus and for applying a voltage to said one junction to compensate said difference of potential so that the static direct current in said load circuit is substantially zero.

5. A semi-conductor apparatus comprising: a semi-conductor body having a first conductivity zone of one type and having a conductivity zone of a second type disposed adjacent one surface of said first zone to constitute therewith a junction; electrodes in ohmic contact with each of said zones; means, including a bias source connected to said electrodes, for developing a potential gradient which establishes a depletion field in said first zone; a pair of contacts engaging said first zone at equi-potential points within said depletion field and at least one of said contacts forming a rectifying junction with said first zone; and means connected to said contacts for establishing a signal-translating load circuit in said apparatus in which the static direct current is substantially zero.

6. A semi-conductor apparatus comprising: a semi-conductor body having a first conductivity zone of one type provided with a recessed portion in one surface thereof and having a conductivity zone of a second type disposed adjacent an opposed surface of said first zone to constitute therewith a junction; electrodes in ohmic contact with each of said zones; means, including a bias source connected to said electrodes to develop a potential gradient which establishes a depletion field in said first zone encompassing said recess; a pair of contacts engaging said recessed portion of said first zone at equi-potential points within said depletion field, at least one of said contacts forming a rectifying junction with said first zone; and means connected to said contacts for establishing a signal-translating load circuit in said apparatus in which the static direct current is substantially zero.

7. A semi-conductor apparatus comprising: a semi-conductor body having a first conductivity zone of one type provided with an elongated recessed portion in one surface thereof and having a conductivity zone of a second type disposed adjacent an opposed surface of said first zone to constitute therewith a junction; electrodes in ohmic contact with each of said zones; a bias source connected to said electrodes to develop a potential gradient which establishes a depletion field in said first zone encompassing said recess; a pair of electrodes disposed within said recessed portion of said first zone at equi-potential points within said depletion field and at least one of said electrodes defining with said first zone a rectifying junction; and means connected to said electrodes for establishing a signal-translating load circuit in said apparatus in which the static direct current is substantially zero.

8. A semi-conductor apparatus comprising: an elongated semi-conductor body having a first conductivity zone of one type provided with an elongated recessed portion in one surface thereof and having a conductivity zone of a second type disposed adjacent an opposed surface of said first zone to constitute therewith a junction; a pair of electrodes disposed on said first zone adjacent opposed sides of said recessed portion; a third electrode disposed on said second conductivity zone; a bias source connected between said third electrode and said pair of electrodes to develop a potential gradient which establishes a depletion field in said first zone encompassing said elongated recess; a pair of elongated electrodes disposed in said recessed portion of said first zone at equi-potential points within said depletion field and at least one of said elongated electrodes defining with said first zone a rectifying junction; and means connected to said pair of elongated electrodes for establishing a signal-translating load circuit in said apparatus in which the static direct current is substantially zero.

References Cited in the file of this patent

UNITED STATES PATENTS

| | | |
|---|---|---|
| 2,600,500 | Haynes | June 17, 1952 |
| 2,666,814 | Shockley | Jan. 19, 1954 |
| 2,672,528 | Shockley | Mar. 16, 1954 |
| 2,764,642 | Shockley | Sept. 25, 1956 |
| 2,820,154 | Kurshan | Jan. 14, 1958 |
| 2,904,704 | Marinace | Sept. 15, 1959 |